United States Patent
Tuffe et al.

(10) Patent No.: US 7,833,637 B2
(45) Date of Patent: Nov. 16, 2010

(54) EASY-TO-CLEAN COOKING SURFACE AND ELECTRICAL HOUSEHOLD APPLIANCE COMPRISING SUCH A SURFACE

(75) Inventors: Stéphane Tuffe, Cognin (FR); Alain Coudurier, Albens (FR)

(73) Assignee: SEB S.A., Ecully (FR)

( * ) Notice: Subject to any disclaimer, the term of this patent is extended or adjusted under 35 U.S.C. 154(b) by 0 days.

(21) Appl. No.: 11/961,415

(22) Filed: Dec. 20, 2007

(65) Prior Publication Data

US 2008/0156197 A1    Jul. 3, 2008

Related U.S. Application Data

(63) Continuation-in-part of application No. 11/856,545, filed on Sep. 17, 2007, now abandoned, which is a continuation-in-part of application No. PCT/FR2006/000360, filed on Feb. 16, 2006.

(30) Foreign Application Priority Data

Mar. 15, 2005  (FR)  .................................. 05 02540

(51) Int. Cl.
    *A47J 27/00*  (2006.01)
(52) U.S. Cl. ........................ 428/698; 428/650; 428/668; 428/674; 428/681; 428/684; 428/685; 99/324
(58) Field of Classification Search ........................ None
    See application file for complete search history.

(56) References Cited

U.S. PATENT DOCUMENTS

| | | | | |
|---|---|---|---|---|
| 2,057,254 A | * | 10/1936 | Sommer | 220/573.1 |
| 2,771,360 A | * | 11/1956 | Malcolm | 420/436 |
| 3,433,631 A | * | 3/1969 | Frank et al. | 420/436 |
| 3,547,098 A | * | 12/1970 | Lee | 126/19 R |
| 3,993,597 A | * | 11/1976 | Stiles | 502/2 |
| 5,549,978 A | * | 8/1996 | Iwasaki et al. | 428/811.2 |
| 6,159,593 A | * | 12/2000 | Iwasaki et al. | 428/811.2 |
| 6,368,706 B1 | * | 4/2002 | Iwasaki et al. | 428/332 |
| 6,395,388 B1 | * | 5/2002 | Iwasaki et al. | 428/332 |
| 6,445,536 B1 | * | 9/2002 | Rudy et al. | 360/125.5 |
| 6,503,340 B1 | * | 1/2003 | Gold et al. | 148/217 |
| 2006/0150824 A1 | * | 7/2006 | Coudurier | 99/324 |

FOREIGN PATENT DOCUMENTS

| | | | |
|---|---|---|---|
| JP | 11077375 | * | 3/1999 |
| JP | 2003276129 | | 9/2003 |
| RU | 2101116 C1 | | 1/1998 |
| RU | 2181023 C2 | | 4/2002 |
| WO | WO 2004064586 A1 | * | 8/2004 |
| WO | WO 2005025394 A2 | * | 3/2005 |

OTHER PUBLICATIONS

Hossain et.al. Journal of Applied Physics. Apr. 1999, vol. 85, No. 8, p. 5998-6000.*

* cited by examiner

*Primary Examiner*—Jennifer C McNeil
*Assistant Examiner*—Vera Katz
(74) *Attorney, Agent, or Firm*—Browdy & Neimark, PLLC

(57) ABSTRACT

Food cooking surface for a kitchen utensil or cooking appliance, constituted by the surface of a compound fabricated starting from an alloy whose two principal components are zirconium and cobalt.

11 Claims, 1 Drawing Sheet

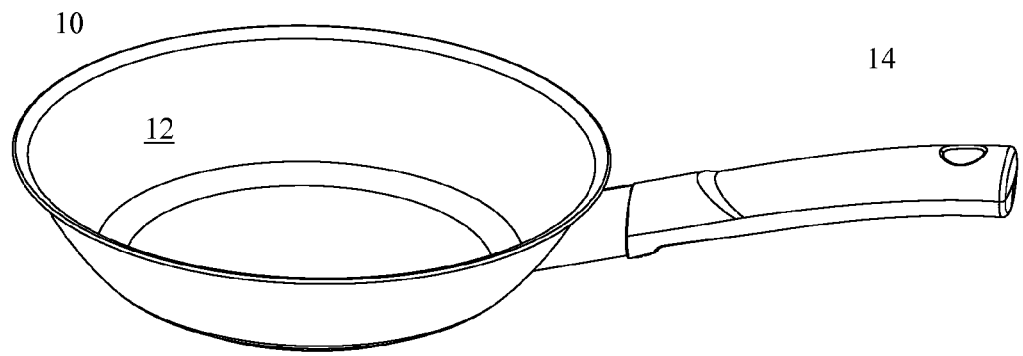
FIG. 1
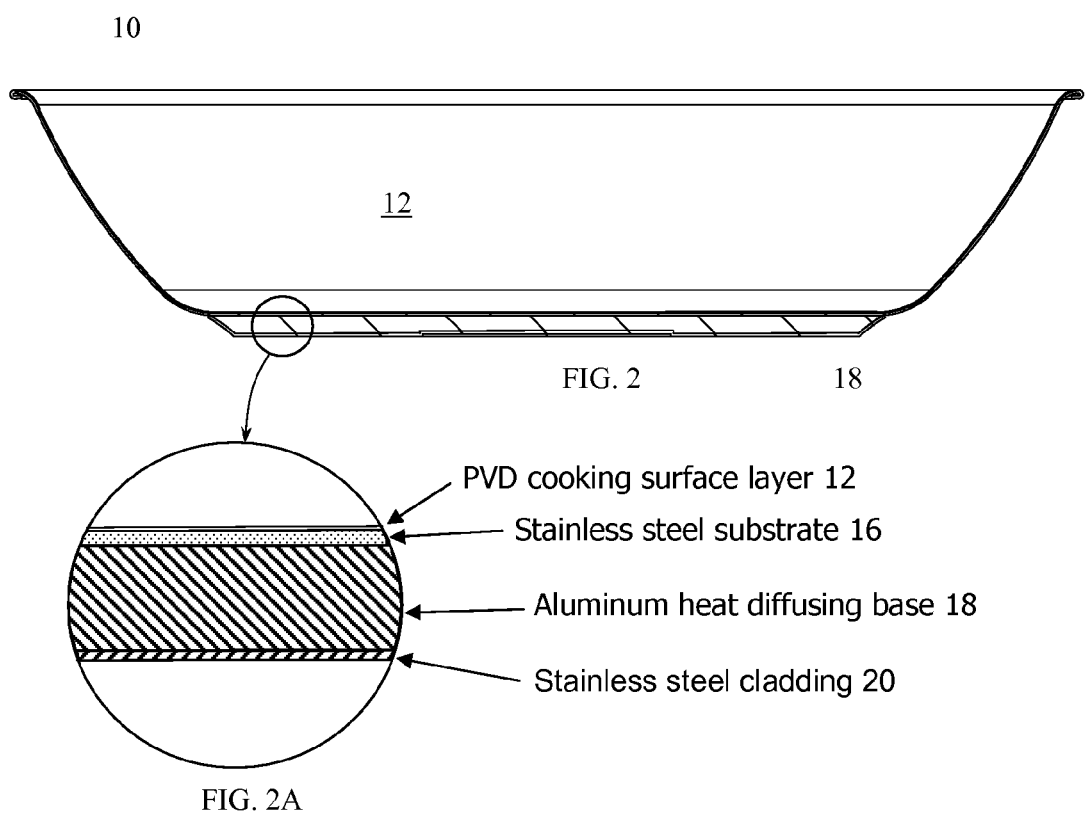
FIG. 2
FIG. 2A

EASY-TO-CLEAN COOKING SURFACE AND ELECTRICAL HOUSEHOLD APPLIANCE COMPRISING SUCH A SURFACE

CROSS-REFERENCE TO RELATED APPLICATION

This is a continuation-in-part of U.S. application Ser. No. 11/856,545, filed on Sep. 17, 2007, now abandoned which is a continuation-in-part of International Application PCT/FR2006/000360, filed Feb. 16, 2006, the disclosure of which is incorporated herein by reference.

BACKGROUND OF THE INVENTION

The present invention relates to the field of articles intended for the preparation and the cooking of food and more particularly the cooking surface of these articles in contact with food to be treated.

For many years, great efforts have been developed in order to facilitate the daily preparation of meals. Among the notable progress, coatings containing fluorocarbonated polymers as a non-stick coating in kitchen utensils quickly developed since the end of 1950. Such coatings are universally known since the process presented in the patent FR 1120749 allowed a sure fixing of such coatings on various metals, such as aluminum.

However, such coatings remain fragile and resist scratching poorly. Thus, clever ways were developed in order to mechanically reinforce the layer on its support. Numerous improvement patents describe methods and means making it possible to increase the scratch resistance of such coatings, by acting on the coating and/or the substrate. Despite everything, such coatings remain sensitive to the repeated use of sharpened or pointed metallic materials, such as knives or forks.

In parallel, developments were carried out on mechanically resistant surfaces on which attempts were made to improve the ease of cleaning. Deposits of metal, such as chrome plating on stainless steel, quasi-crystals, or nonmetals (silicates, . . . ) thus appeared. The results remain however disappointing, in particular in comparison with coatings of the PTFE type.

There is also known, from the document FR 2 848 797, a cooking surface composed in major part of metallic zirconium, surface which has a very good hardness, since the layer is nitrided or carburized, presenting satisfactory ease of cleaning but without attaining the ease of cleaning of layers of the PTFE type.

BRIEF SUMMARY OF THE INVENTION

The present invention aims at remedying the above mentioned disadvantages of the prior art, by proposing a cooking surface with improved ease of cleaning characteristics, durably presenting a reduction of the adherence of food during cooking, and corrosion resistance, while having a good mechanical resistance, and in particular a high hardness.

The present invention is achieved by a food cooking surface for a kitchen utensil or cooking appliance, characterized in that this cooking surface is a compound developed starting from an alloy whose two principal components are zirconium and cobalt.

According to preferred embodiments of the present invention, the cooking surface, such as for a frying pan or a shallow pot, is formed by a ZrCoN, ZrCoCN, ZrCoCrN, or ZrCoCrCN compound layer, or stratum, or film, to provide a hard surface with easy cleaning properties.

BRIEF DESCRIPTION OF THE DRAWINGS

FIG. 1 is a perspective view of a frying pan provided with a cooking surface layer according to the invention.

FIG. 2 is a simplified cross-sectional view showing the components of frying pan of FIG. 1, with the handle omitted.

FIG. 2A is a cross-sectional detail view of a circled part of the pan of FIG. 2.

DETAILED DESCRIPTION OF THE INVENTION

FIG. 1 shows a frying pan 10 composed of a base provided with a cooking surface formed by a layer 12 and a handle 14.

FIGS. 2 and 2A show that the pan may, for example, be composed of a substrate 16, possibly of stainless steel, on which layer 12 is deposited. Substrate 16 is secured on a heat diffusing, or distributing, base 18 and the bottom of the pan is provided with a cladding 20, which may also be made of stainless steel. At least substrate 16 extends over the side of the pan and cladding 20 may also be disposed along the outer surface of the side of the pan.

Metal alloys containing cobalt are known for their good wear resistance.

Surprisingly, applicants have noted, during tests, that alloys based on cobalt and zirconium also present properties of ease of cleaning when such surfaces were used as a cooking surface and when foodstuffs remained attached to the surface, for example after a calcination of the cooked products. This ease of cleaning can be expressed by the possibility of easily removing elements carbonized on the cooking surface.

This ease of cleaning is accompanied, at the time of production of the compound, by an increase in hardness of said compound.

Moreover, the use of zirconium makes it possible to obtain very varied colors of the coating, which it is not possible to obtain only with cobalt. It is then possible to define a coating color making it possible to identify clearly, for the user, that the coating used is specific and corresponds to an "easy to clean" coating. One can even envision connecting the various colors to the results of the tests of ease of cleaning of cooking surfaces according to the food, so that this color code makes it possible for users to easily identify the good cooking surface for cooking a given type of food (eggs, fish, meat, . . . ).

Advantageously, the alloy essentially contains zirconium and cobalt, and optionally chromium. Chromium and cobalt alloys, such as Alacrite®, are generally known for their exceptional resistance to corrosion (essentially by the chromium), and their good wear resistance (essentially by the cobalt). They are primarily used, in mechanics, for interior lining of piston bearings. Certain slightly different alloys are used in the medical field for the fabrication of implants and prostheses.

The presence of chromium thus makes it possible to reinforce the resistance of the cooking surface to chemical agents and corrosion.

The development of the cooking surface has a step of deposition of the components, in an appropriate thickness, on a substrate, followed by a nitriding or carbonitriding of the components. Such a nitriding or carbonitriding, primarily of the zirconium, makes it possible to increase considerably the hardness of the cooking surface, while bringing diversity to the colors obtained, primarily by exploiting the stoichiometry of zirconium nitride.

Advantageously, the development of said surface has a step of carburization or carbonitriding of the surface after the stage of nitriding, making it possible to further increase the surface hardness of the layer, to make it almost insensitive to scratching, without altering its ease of cleaning properties. In addition, the nitriding step allows a good adherence of the carbide or carbonitride layer of CoCrZr. It is indeed known in addition, that it is very difficult to cause a layer of carbide or carbonitride to adhere to a substrate of the aluminum or stainless steel type without an intermediate layer. In addition, the deposition rate of a layer of carbide is definitely higher than the deposition rate of a layer of nitride.

The gradient of the composition thus obtained combines the properties of ease of cleaning of Co/Cr alloy surfaces with the high potential of hardening, of coloring and of corrosion resistance of the layer of nitride, carbide and/or carbonitride of zirconium. The hardnesses obtained can go up to 2500 Vickers for a zirconium carbide.

According to a preferred mode of preparation, the deposition of the components on a substrate will be a physical deposition in vapor phase from one or several massive targets. In this latter case the target can be obtained by assembly on a copper deposition substrate of one or more sheets or plates of material having the desired composition, said sheets or plates being obtained either by powder sintering or thermal projection of powder, or resulting from casting. These targets thus constitute the source of the materials that will be deposited on the cooking surface. Generally, any of the techniques of physical deposition in vapor phase can be used.

This implementation has the advantage of using little material and of being able to adjust a small thickness of material on the substrate in order to produce the cooking surface. This deposition technique makes it possible, in addition, to obtain deposits in strong cohesion with the substrate on which they are deposited. The risks of separation of the deposit during use are thus minimized.

The substrate can be composed of one or more metal sheets of following materials: aluminum, stainless steel, cast iron, steel, copper.

Other advantages resulting from tests will appear from a reading of the description that will follow, relating to an illustrative example of the present invention given as a non-limiting example.

The various examples of realization of the invention relate to a deposition, on a stainless steel substrate, by PVD, of a Co/Zr alloy by using the four eutectic points of the binary diagram of Co/Zr. The percentage, in weight, of zirconium, for these four eutectics, is thus 14%, 57.5%, 74% and 85%. One face of this deposit has undergone a mechanical surface treatment, before the performance of tests, in order to make it similar to other cooking surfaces so that the tests of evaluation of the ease of cleaning such a surface, in a domestic cooking use, can be compared. The deposited thickness is of the order of several microns, e.g. 3-4 microns.

After deposition of the components, the layer underwent a nitriding, then a carbonitriding. The longer the phase of carbonitriding, the more the surface will be hard.

The system for evaluation of the ease of cleaning makes it possible to quantify the capacities of a cooking surface to return to its original appearance after use. This system of evaluation comprises the following steps:
  the surface is locally covered with a food mixture of known composition,
  this mixture is carbonized in a furnace under defined conditions, for example 210° C. during 20 minutes,
  after cooling, the surface is put to soak for a controlled time in a mixture of water and detergent,
  an abrasive pad is then applied under a defined constraint using an apparatus to abrade (plynometer) the soiled surface in a back and forth movement during a given number of cycles,
  the percentage of the correctly cleaned surface is noted and characterizes the ease of cleaning of the cooking surface.

The tests carried out on various types of surface thus make it possible to comparatively evaluate the quality of the surfaces as regards their ease of cleaning. Of course, the tests are carried out by respecting the same parameters for each step of the system of evaluation: the same food mixture, the same surface of application of the food mixture, the same temperature of carbonization, . . .

The following comparative table shows the results obtained on three different cooking surfaces, namely polished stainless steel, quasi-crystals, and the cobalt/zirconium alloy according to one of the eutectics cited, deposited on stainless steel, nitrided then carbonitrided, as previously described, after polishing, in a severe test with a food composition containing milk and rice considered to be difficult to clean once carbonized. Such a test thus makes it possible to highlight well the differences between quality of cleaning of the surfaces.

|  | Polished stainless steel | Quasi-crystals | Co/Zr alloy nitrided/carbonitrided on stainless steel |
| --- | --- | --- | --- |
| Quantity of carbonized residue removed | 50% | 60% | 90% |

The table shows without ambiguity the very favorable results obtained with the Co/Zr alloy deposited on stainless steel, and in particular the results compared with other cooking surfaces. Other tests carried out on an aluminum base show similar results. The ease of cleaning for an alloy according to the invention, as set forth in the table above, is substantially the same for any of the eutectic composition percentages cited earlier herein.

It should be noted that the number of cycles of abrasion on the plynometer was fixed at 18. This reduced number of cycles highlights well the quality of ease of cleaning of the surface according to the invention since there remains not more than 10% of the surface soiled after 18 back and forth passes of the abrasive pad.

Repetitive tests after complete cleaning of the surface show that the ease of cleaning of the alloy presented is not altered.

When the implementation of the invention implies the use of a substrate, this latter is then composed of one or more metal sheets of the following materials: aluminum, stainless steel, cast iron, steel, copper.

According to certain preferred embodiments, the compound, or alloy, according to the invention could be composed of 50% to 90% Zr, with the balance being Co or Co and Cr. Nitriding can be performed with $N_2$ as the reactant and carbonitriding can be performed with $N_2+CH_4$ or $C_2H_2$ gas as the reactant, the reactant preferably being in a stoechiometric quantity.

Typically, the PVD process is carried out at low pressure, equal to or less than 1 Pa, and at a temperature in the range of 100° C. to 300° C. Higher temperatures may be employed, for example to modify the microstructure of the layer forming the cooking surface, for example to reduce porosity.

Layers providing cooking surfaces according to embodiments of the invention may include nitrides or carbonitrides of Zr, Co, and possibly Cr in the form of a binary or ternary alloy.

According to certain embodiments of the invention, a ZrCoN alloy film, or layer, is formed by first depositing a first metallic film and then depositing a nitride layer on the first metallic film by a physical vapor deposition. This technique provides the possibility of imparting a broad range of color to the cooking surface, depending on the stoichiometry of the alloy, as well as a very high hardness, a stable color and an easy to clean surface.

A composition, in atomic weight percent, that gave a very good compromise between ease of cleaning and high hardness is: 25% Zr, 18% Co, 32% C and 25% N.

This composition was achieved by using Argon as a bombarding gas and nitrogen and acetylene as reactive gases.

Ease of cleaning properties were measured and ranked with a score going from 1 to 5 (5 being the best result) for various compositions that were tested and compared with respect to those properties, the results being shown in the following table, where the proportions of components are given in atomic weight percent:

|   | Zr | Co | N | CN | Ease of cleaning |
|---|---|---|---|---|---|
| Composition 1 | 25% | 18% | 0% | 57% | 4 |
| Composition 2 | 20% | 20% | 59% | 0% | 4 |
| Composition 3 | 30% | 15% | 55% | 0% | 4.5 |
| Composition 4 | 15% | 25% | 60% | 0% | 5 |

In the coating process to form a ZrCoN layer, the color of the coating can be changed from grey to dark anthracite by changing the composition ratio of Zr/Co and Zr/N.

In accordance with the invention, chromium can be added to cobalt to increase the hardness and corrosion resistance.

In the method according to the invention, as described above, a frying pan can be obtained in which the surface of the pan has an excellent color stability over the whole upper surface, or cooking surface, which color does not change during cooking up to temperatures of 350° C.

According to the invention, it is possible to stabilize the color of ZrCoN layers with oxygen with a heat treatment to form a thin ZrCoNO film on the very top surface. This stabilization can be achieved in the PVD apparatus by introducing oxygen at the nitrogen flow rate at the end of the deposition process.

The conditions for fabricating a coating according to the present invention depend on the characteristics of the deposition apparatus employed and, for a given apparatus and given coating composition, can be readily determined by those skilled in the art.

This application relates to subject matter disclosed in French Application number FR 06 09963, filed on Nov. 15, 2006, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. Food cooking surface for a kitchen utensil or cooking appliance, wherein said cooking surface is a compound fabricated starting from an alloy having zirconium and cobalt as principal components, and wherein said compound is a compound selected from the group consisting of: ZrCoN; ZrCoCN; ZrCoCrN; and ZrCoCrCN.

2. Food cooking surface for a kitchen utensil or cooking appliance according to claim 1, wherein fabrication of said cooking surface comprises:
deposition of the alloy on a substrate; and a stage of nitriding of the alloy after deposition of the alloy.

3. Food cooking surface for a kitchen utensil or cooking appliance according to claim 2, wherein fabrication of said cooking surface comprises a step of carburization or carbonitriding of the surface after the step of nitriding.

4. Food cooking surface for a kitchen utensil or cooking appliance according to claim 2, characterized in that the deposition is carried out by physical deposition in vapor phase from one or several massive targets.

5. Food cooking surface for a kitchen utensil or cooking appliance according to claim 4, characterized in that the deposition is carried out starting from a target obtained by assembly on a copper substrate of one or more sheets or plates of material having the desired composition, said sheets or plates being obtained either by powder sintering or thermal powder projection, or resulting from casting.

6. Food cooking surface for a kitchen utensil or cooking appliance according to claim 2, characterized in that the substrate is composed of one or more metal sheets of the following materials: aluminum, stainless steel, cast iron, steel, and copper.

7. A kitchen utensil or cooking appliance comprising a cooking base and the cooking surface as defined in claim 1 disposed on said base.

8. The kitchen utensil or cooking appliance of claim 7, wherein said cooking surface consists essentially of one of: ZrCoCrN; and ZrCoCrCN.

9. The kitchen utensil or cooking appliance of claim 7, wherein said cooking surface consists essentially of ZrCoN or ZrCoCN.

10. The kitchen utensil or cooking appliance of claim 7, further comprising a substrate disposed on said base, said cooking surface being formed on said substrate.

11. The kitchen utensil or cooking appliance of claim 10, wherein said substrate comprises at least one sheet of stainless steel, aluminum, cast iron, steel, or copper.

* * * * *